US008208290B2

(12) United States Patent
Rao et al.

(10) Patent No.: US 8,208,290 B2
(45) Date of Patent: Jun. 26, 2012

(54) SYSTEM AND METHOD TO MANUFACTURE MAGNETIC RANDOM ACCESS MEMORY

(75) Inventors: Hari M. Rao, San Diego, CA (US); Seung Kang, San Diego, CA (US); Xiaochun Zhu, San Diego, CA (US); Sean Li, San Diego, CA (US); Ken Lee, San Diego, CA (US); Matthew M. Nowak, San Diego, CA (US); Robert J. Walden, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 355 days.

(21) Appl. No.: 12/547,757

(22) Filed: Aug. 26, 2009

(65) Prior Publication Data

US 2011/0051509 A1 Mar. 3, 2011

(51) Int. Cl.
*G11C 11/00* (2006.01)
(52) U.S. Cl. ........... 365/158; 365/63; 365/171; 365/173
(58) Field of Classification Search ................... 365/158, 365/171, 173, 63
See application file for complete search history.

(56) References Cited

U.S. PATENT DOCUMENTS

| | | | |
|---|---|---|---|
| 6,365,419 B1 | 4/2002 | Durlam et al. | |
| 6,548,849 B1 | 4/2003 | Pan et al. | |
| 6,890,770 B2 | 5/2005 | Grynkewich et al. | |
| 7,116,593 B2 | 10/2006 | Hanzawa et al. | |
| 7,324,372 B2 | 1/2008 | Hanzawa et al. | |
| 7,330,371 B2 * | 2/2008 | Gaidis et al. | 365/158 |
| 7,335,907 B2 | 2/2008 | Terao et al. | |
| 7,349,235 B2 | 3/2008 | Miyatake et al. | |
| 7,532,505 B1 * | 5/2009 | Ding | 365/158 |
| 2002/0057593 A1 | 5/2002 | Hidaka | |
| 2004/0119101 A1 | 6/2004 | Schrom et al. | |
| 2004/0184331 A1 | 9/2004 | Hanzawa et al. | |
| 2004/0233748 A1 | 11/2004 | Terao et al. | |

(Continued)

FOREIGN PATENT DOCUMENTS

JP 2005158985 6/2005

OTHER PUBLICATIONS

International Search Report and Written Opinion—PCT/US2010/046863, International Search Authority—European Patent Office—Nov. 30, 2010.

(Continued)

*Primary Examiner* — Son Dinh
(74) *Attorney, Agent, or Firm* — Sam Talpalatsky; Nicholas J. Pauley; Jonathan T. Velasco (57) ABSTRACT

A system and method to manufacture magnetic random access memory is disclosed. In a particular embodiment, a method of making a magnetic tunnel junction memory system includes forming a portion of a metal layer into a source line having a substantially rectilinear portion. The method also includes coupling the source line, at the substantially rectilinear portion, to a first transistor using a first via. The first transistor is configured to supply a first current received from the source line to a first magnetic tunnel junction device. The method includes coupling the source line to a second transistor using a second via, where the second transistor is configured to supply a second current received from the source line to a second magnetic tunnel junction device.

38 Claims, 7 Drawing Sheets

U.S. PATENT DOCUMENTS

2006/0037083 A1  2/2006  Kortum et al.
2006/0198196 A1  9/2006  Abe et al.
2006/0280010 A1  12/2006  Hanzawa et al.
2007/0091674 A1  4/2007  Park et al.
2007/0114606 A1  5/2007  Hoshino et al.
2007/0158699 A1  7/2007  Watanabe et al.
2008/0062736 A1  3/2008  Hanzawa et al.
2008/0089154 A1  4/2008  Terao et al.

OTHER PUBLICATIONS

Pina C A ED—Institute of Electrical and Electronics Engineers: "Implementation of a MCM brokerage service", Proceedings of the Multi Chip Module Conference (MCMC). Santa Cruz, Mar. 15-18, 1993; [Proceedings of the Multi Chip Module Conference (MCMC)], Los Alamitos, IEEE Comp. Soc. Press, US, vol . Conf. 2, Mar. 15, 1993, pp. 46-51, XP010095460.

* cited by examiner

FIG. 7

SYSTEM AND METHOD TO MANUFACTURE MAGNETIC RANDOM ACCESS MEMORY

I. FIELD

The present disclosure is generally related to manufacturing Magnetic Random Access Memory (MRAM).

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Magnetic Random Access Memory (MRAM) may be incorporated in systems where power conservation is a consideration, such as embedded memory applications. Improvements in manufacturing MRAM that result in lower manufacturing costs help to make MRAM a more viable alternative to other types of memory.

III. SUMMARY

In a particular embodiment, a method of making a magnetic tunnel junction (MTJ) memory system is disclosed. The method includes forming a portion of a metal layer into a source line having a substantially rectilinear portion, and coupling the source line, at the substantially rectilinear portion, to a first transistor using a first via. The first transistor is configured to supply a first current received from the source line to a first magnetic tunnel junction (MTJ) device. The method also includes coupling the source line to a second transistor using a second via, where the second transistor is configured to supply a second current received from the source line to a second magnetic tunnel junction (MTJ) device.

In another particular embodiment, an apparatus is disclosed that includes a memory to store data. The memory includes a first transistor including a first source terminal, a first magnetic tunnel junction (MTJ) device connected to the first transistor, and a source line that is conductive and that includes a first region that is substantially rectilinear. The source line is to supply a first current to the first transistor at the first source terminal. The source line is coupled from the first region to the first source terminal using a first via, and the source line is to supply a second current to a second transistor.

In another particular embodiment, a computer-readable tangible medium is disclosed and includes computer-executable instructions to cause a semiconductor fabrication system to form a source line including conductive material having a substantially rectilinear region. The source line is to supply current to a first memory cell and to a second memory cell. The first memory cell includes a first transistor coupled to the source line using a first via, where the first transistor is to supply a first current to a first magnetic tunnel junction (MTJ) device. The second memory cell includes a second transistor coupled to the source line using a second via. The second transistor is to supply a second current to a second MTJ device.

Improvements resulting from the disclosed structure can include simplified layouts, simplified three-dimensional topographies, and reduced resistances in current carrying lines.

One particular advantage provided by at least one of the disclosed embodiments is increased manufacturability of MRAM due at least partially to simplicity of a source line design. Another particular advantage provided by at least one of the disclosed embodiments is reduced resistance of connecting lines, which can result in reduced power consumption.

Other aspects, advantages, and features of the present disclosure will become apparent after review of the entire application, including the following sections: Brief Description of the Drawings, Detailed Description, and the Claims.

V. DETAILED DESCRIPTION

Figure 1:
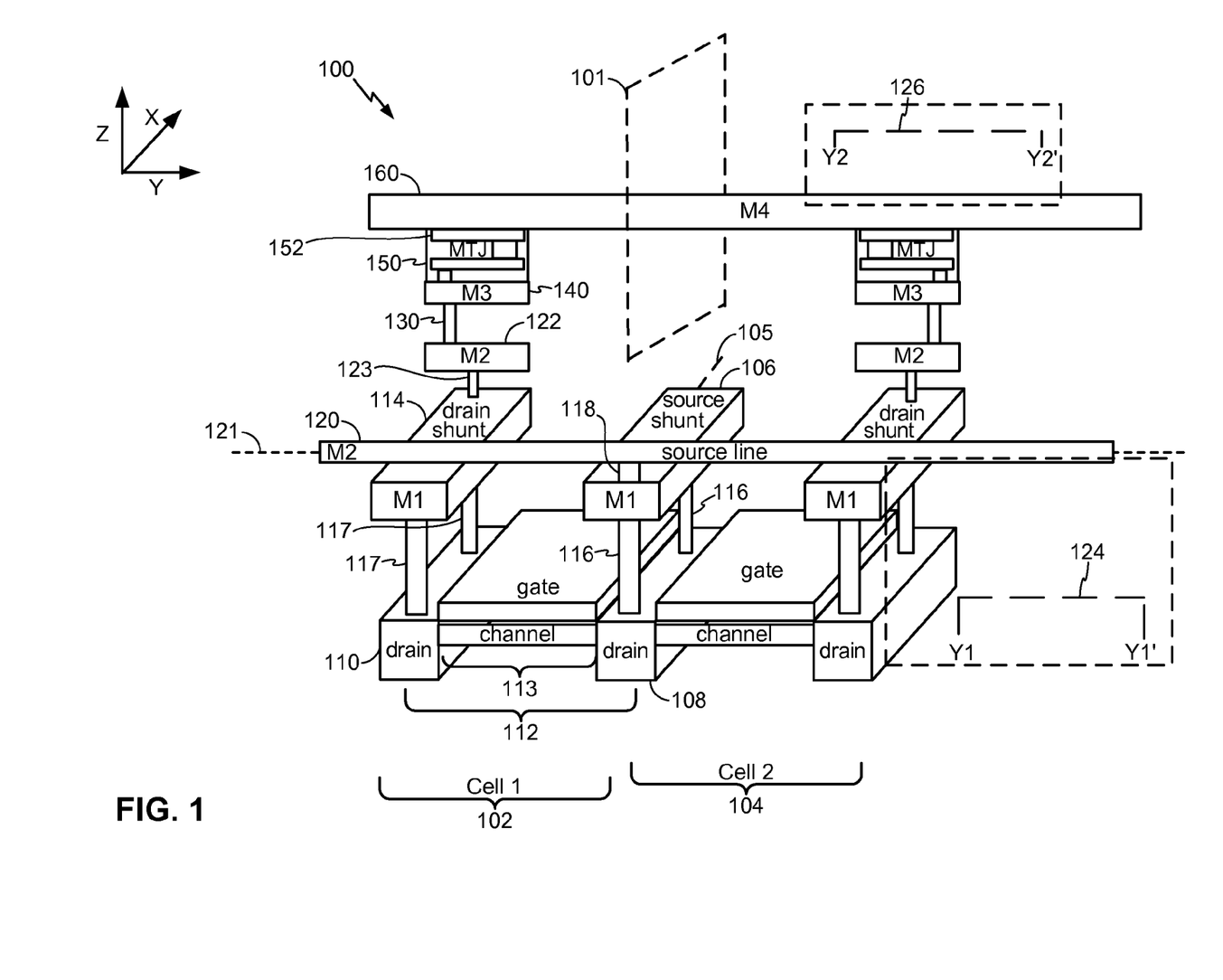
FIG. 1 is a block diagram of a particular embodiment of an MRAM apparatus.

Referring to FIG. 1, a block diagram of a particular embodiment of a magnetic random access memory (MRAM) (also "memory") apparatus is disclosed and generally designated 100. The apparatus 100 includes a first MRAM cell 102 and a second MRAM cell 104. While the apparatus 100 depicts only two cells to simplify description of the MRAM apparatus 100, it should be understood that an MRAM apparatus includes more than two cells. The first MRAM cell 102 and the second MRAM cell 104 are substantially identical, with corresponding components situated in mirror image positions with respect to one another on either side of a mirror image plane 101. Component parts of the first MRAM cell 102 will be described in detail. Each component part of the first MRAM cell 102 may be found in the second MRAM cell 104.

The first MRAM cell 102 includes a transistor 112 that includes a source 108 that is shared with the second MRAM cell 104, a channel region 113, and a drain 110. Situated above the transistor 112 is a first metal layer M1. The first metal layer may be separated into portions that are insulated from one another. For instance, a first portion 118 serves as a source contact shunt (source shunt) 106, i.e., an electrical conductor that couples two or more source contacts. A second portion 114 in M1 serves as a drain contact shunt (drain shunt) 114, i.e., an electrical conductor that couples two or more drain connectors. The source contact shunt 106 can be connected to the source 108 by one or more source contacts 116. The apparatus 100 of FIG. 1 depicts two contacts 116 connecting the source 108 to the source contact shunt 106. By having two source contacts 116, resistance between the source contact shunt 106 and the source 108 may be reduced, because the source contacts 116 are electrically in parallel.

The source contact shunt 106 is electrically connected to a source line 120 by a via 118 that is conductive. The source line 120 is located in a second metal layer M2, which is electrically insulated from the first metal layer M1. The source line 120 in M2 can provide a source current to the source 108 through the via 118, the source contact shunt 106, and the source contacts 116. As shown in the apparatus 100, the source line 120 is substantially rectilinear in shape, i.e., the source line 120 has a substantially straight portion and that is formed in M2, and the source line 120 is substantially perpendicular to a major axis 105 of the source contact shunt 106. The source line 120 is substantially branchless, which means that there are essentially no branches extending from a major axis 121 of the source line 120. In a particular illustrative embodiment, the source line 120 has a rectangular cross-section. Because the source line 120 is substantially rectilinear (straight line) in shape with no branches, manufacturability of the MRAM apparatus 100 may be enhanced because manufacturing a rectilinear source line can be substantially simpler than manufacturing a source line that includes branches.

A drain contact shunt 114 is also formed in M1 and is electrically insulated from the source contact shunt 106. In a particular illustrative embodiment, the drain contact shunt 114 is electrically connected to the drain 110 by two drain contacts 117. In another particular illustrative embodiment, there can be more than two drain contacts or less than two drain contacts. By having at least two drain contacts 117 operating in parallel, resistance between the drain contact shunt 114 and the drain is less than the resistance associated with one drain contact 117.

The drain contact shunt 114 is electrically connected to a portion 122 of the M2 layer that is electrically isolated from the source line 120. The portion 122 is connected to a lower contact 140 of a magnetic tunnel junction (MTJ) 150 by an electrical via 130. The lower contact 140 of the MTJ 150 is located in a metal layer M3. Other portions of the M3 layer are electrically insulated from the M2 layer. Thus, the electrical via 130 connects the portion 122, which is connected to the drain contact shunt 114, to the lower contact 140 of the MTJ 150. An upper contact 152 of the MTJ 150 is electrically connected to a portion 160 of a fourth metal layer M4, which is situated above the M3 layer and is insulated from the M3 layer.

In a particular illustrative embodiment, the apparatus 100 includes a processor (not shown) to retrieve a portion of data stored in the memory 100 and to provide processed data to an output device (not shown). In a particular illustrative embodiment, the apparatus 100 is operative to provide wireless communication to a remote device (not shown). For example, the remote device is one of a cell phone and a personal digital assistant. In a particular illustrative embodiment, the apparatus 100 includes a device (not shown), selected from the group consisting of a set-top box, a music player, a video player, an entertainment unit, a navigation device, a communications device, a personal digital assistant (PDA), a fixed location data unit, and a computer, into which the apparatus 100 is integrated.

In operation, the source 108 is shared by cells 102 and 104, providing current to each of the first MRAM cell 102 and the second MRAM cell 104. The source 108 receives current from the source line 120, located in M2, through the electrical via 118 to the source contact shunt 106 and the source contacts 116.

The MTJ 150 in the first MRAM cell 102 is located off axis, i.e., non-central with respect to the transistor 113, allowing additional metallic lines in higher layers, such as M3 and M4, to be located proximate to the transistor 113. For example, another portion (not shown) of M2 can be located proximate to the source line 120 and insulated from the source line 120, providing an electrical path that can be used to communicate information.

Included in FIG. 1 are cross section indicators 124 and 126. The cross section indicator 124 indicates an orientation of a vertically oriented planar cross-section that includes the indicator 124. The cross-section indictor 124 is located in a foreground portion of FIG. 1. The cross section indicator 126 shows an orientation of a second cross section plane parallel to the cross section plane that includes indicator 126 and situated at a background portion of the apparatus 100. Each of the cross section indicators 124, 126 is representative of a different cross section plane that will be referred to in a later Figure.

Figure 2:
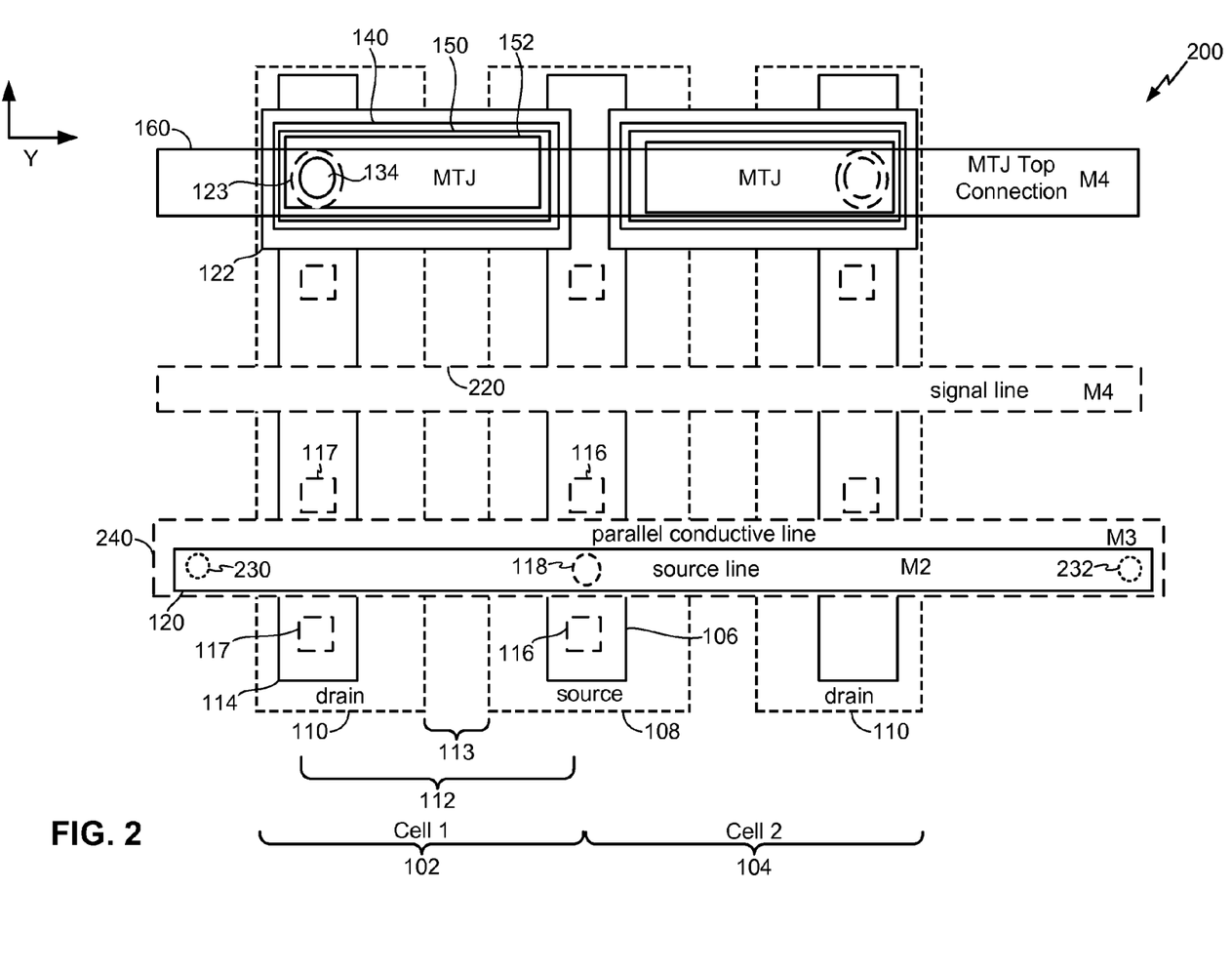
FIG. 2 is an overhead view of a particular embodiment of an MRAM apparatus.

FIG. 2 is an overhead view of a particular embodiment of a MRAM apparatus, generally designated 200. The apparatus 200 depicted in FIG. 2 is substantially the same apparatus as the apparatus 100 depicted in FIG. 1. A numbered identifier in FIG. 2 that is identical with a numbered identifier in FIG. 1 refers to a common element. The apparatus 200 includes the first MRAM cell 102 and the second MRAM cell 104, arranged in a mirror image layout with respect to one another. Within the MRAM cell 102, a transistor 112 includes a source 108, a drain 110, and a channel 113. The source contact shunt 106 is situated above the source 108 and is electrically connected to the source 108 by one or more source contacts 116. A source line 120, which is substantially rectilinear over a portion thereof, is situated above the source contact shunt 116 in a second metal layer M2 and is connected to the source contact shunt 116 via an electrical via 118. The drain 110 is connected to a drain contact shunt 114 by one or more drain contacts 117.

A parallel conductive line 240 is situated in a metal layer M3 that is above the metal layer M2. The parallel conductive line 240 can be connected to a portion of the source line 120 by a plurality of electrical vias 230 (vias 230 and 232 are shown in FIG. 2), providing an electrical path in parallel with the source line 120 that lowers resistance of the portion of the source line 120. A signal line 220 (not shown in FIG. 1) located in the metal layer M4 and insulated from other metal lines can provide a path to send electrical signals. The signal line 220 shown in FIG. 2 is not connected electrically to the MRAM cell 102 or to the MRAM cell 104.

A conductive portion 122 situated in the M2 layer is connected to the drain contact shunt 114 by a conductive via 123. The portion 122 is electrically insulated from the source line 120. The portion 122 is electrically connected to a lower contact 140 of a metallic tunnel junction (MTJ) 150. An upper contact 152 of the MTJ 150 is electrically connected to a metallic line 160, located in a M4 layer situated above the M3 layer.

In operation, the source line 120 provides electrical current to each of the MRAM cells 102 and 104 through the source contact shunt 106 to the common source 108. Advantages of the apparatus 200 include off-center location of the MTJ 150, rectilinear source line 120 and parallel conductive line 240, use of multiple source contacts and multiple drain contacts, and portions of M2 employed in unrelated uses. By locating the MTJ 150 off center, space is provided to accommodate portions of the M2 layer including the signal line 220 and the source line 120. The rectilinear shape of the source line 120 simplifies manufacturing by simplifying fabrication masks to achieve the source line's shape. The parallel conductive line 240 lowers resistance of the source line 120. A plurality of source contacts 116 reduces electrical resistance between the source 108 and the source line 120. A plurality of drain contacts 117 reduces resistance between the drain 110 and the drain contact shunt 114. By electrically isolating portions of the M2 layer, the M2 layer can be used in a variety of functions.

Figure 3:
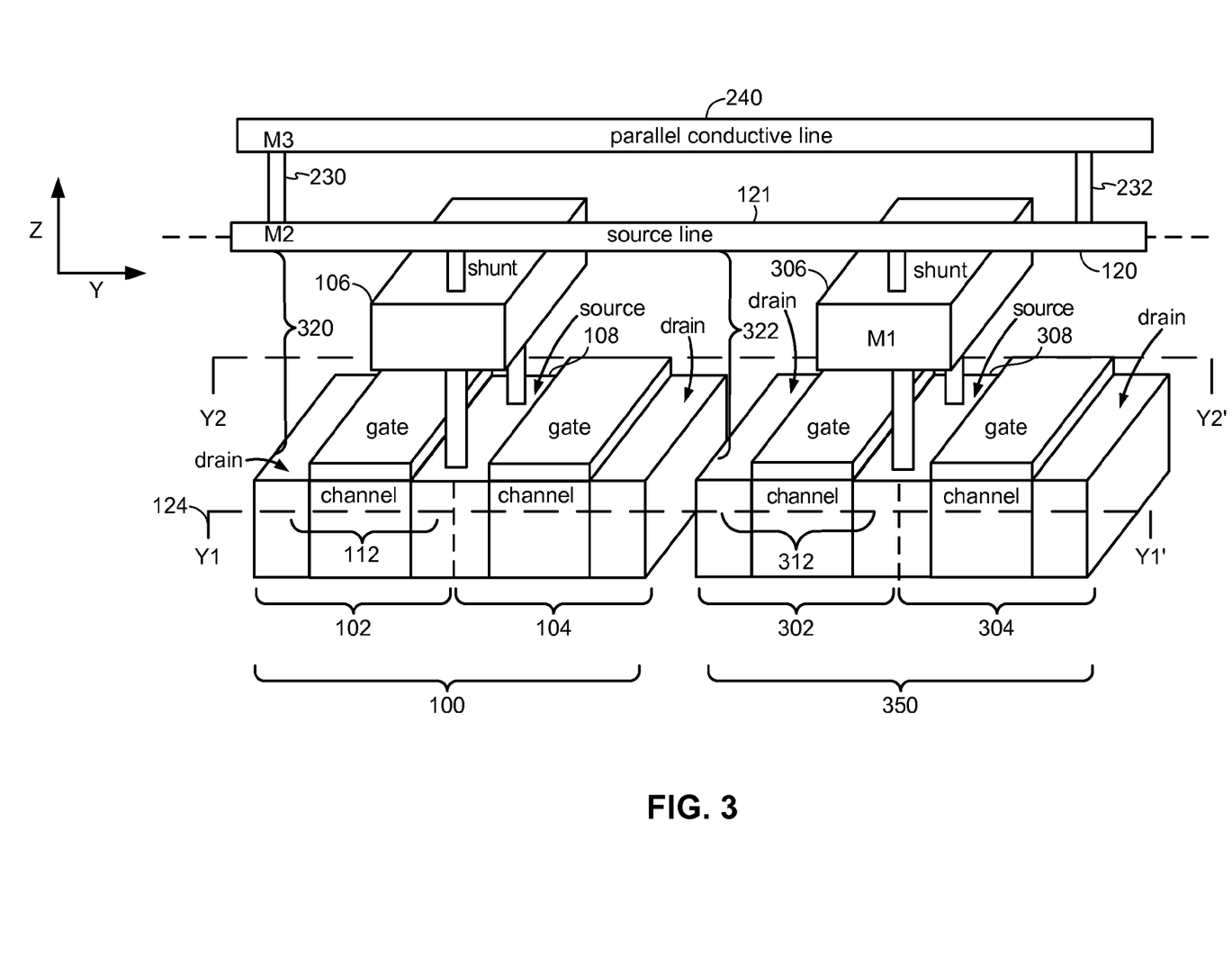
FIG. 3 is a block diagram of a cross-section of a particular embodiment of an MRAM system.

FIG. 3 is a block diagram of a cross-section of a particular embodiment of an MRAM system, and is generally designated 300. The system 300 includes a first subsystem 100 that is the apparatus 100 of FIG. 1 (cross-section indicator 124 of FIG. 1, Y1-Y1'), and a sub-system 350. The sub-system 100 has been depicted in FIG. 1 and includes the first MRAM cell 102 and the second MRAM cell 104. The sub-system 350 includes a third MRAM cell 302 and a fourth MRAM cell 304. A source line 120 located in the M2 layer is substantially rectilinear in shape and is substantially branchless, i.e., the source line 120 has no branches extending from a major axis 121 of the source line 120. In a particular illustrative embodiment, the M2 layer is substantially planar and is located at a first distance 320 from the first transistor 112 in the first MRAM cell 102 and is located at a second distance 322 from a second transistor 312 in the third MRAM cell 302. In a particular illustrative embodiment, the first distance 320 and the second distance 322 are substantially the same. The source line 120 supplies source current to the sub-system 100 and to the sub-system 350 via corresponding source contact shunts 106 and 306 that provide source current to the corresponding sources 108, 308 through one or more corresponding source contacts. Thus, the source line 120 provides source current to the MRAM cells 102 and 104 via the common source 108 and to the MRAM cells 302 and 304 by the common source 308. A parallel conductive line 240 is connected in parallel with the source line 120. The conductive line 240 is situated in a M3 layer above the M2 layer and is connected in parallel to a portion of the source line 120 by at least two vias, including the vias 230 and 232. The conductive line 240 serves to lower resistance of the source line 120. In operation, the source line 120 is substantially branchless and supplies source current to multiple MRAM cells. Multiple source contacts in each subsystem 100 and 350 lower source contact resistance to the source line 120.

Figure 4:
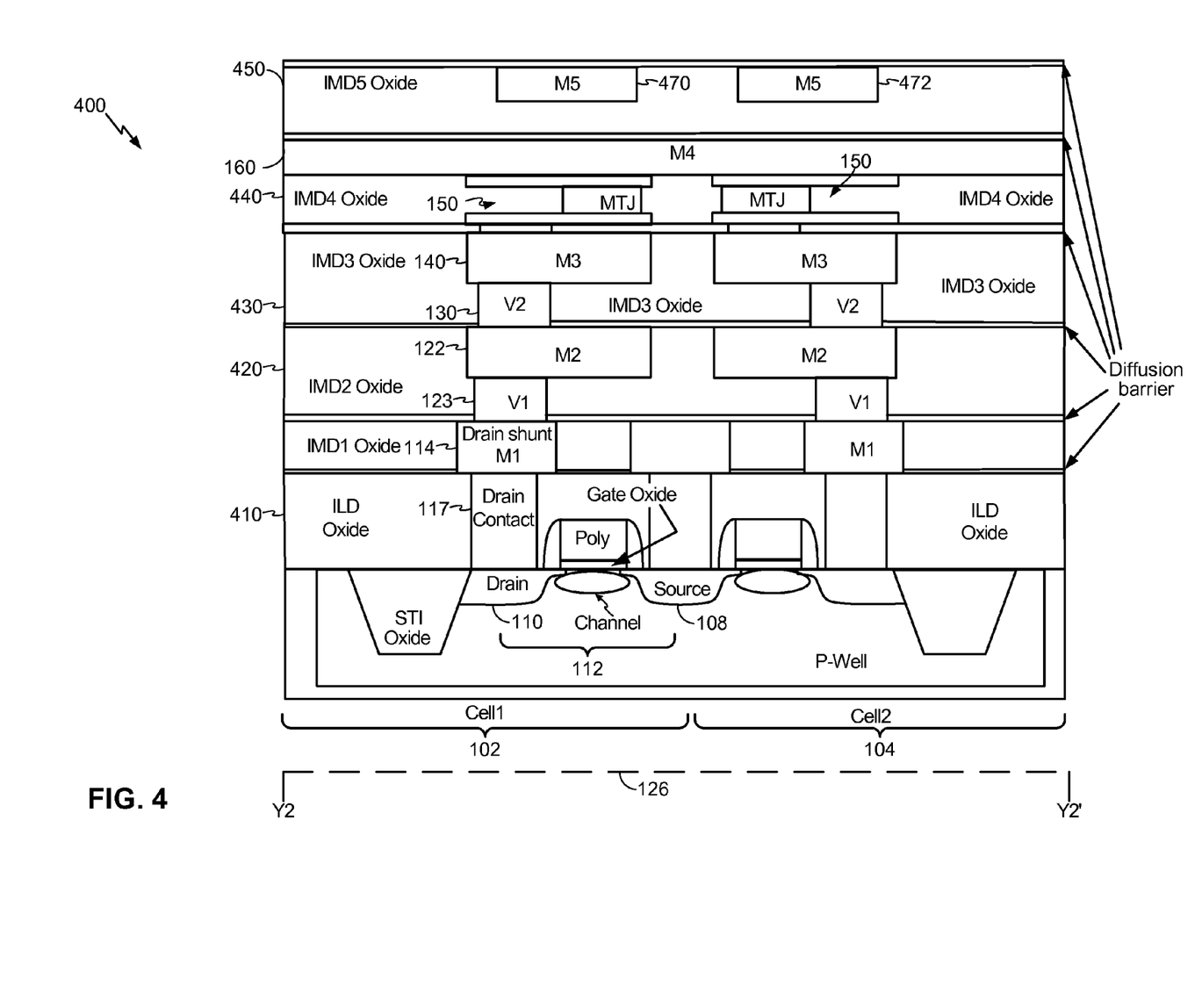
FIG. 4 is a diagram of a cross-section of the MRAM apparatus of FIG. 1.

FIG. 4 is a diagram of a cross-section of the MRAM apparatus 100 of FIG. 1, and is generally designated 400. The apparatus 400 includes the first MRAM cell 102 and the second MRAM cell 104. The first MRAM cell 102 and the second MRAM cell 104 are oriented as mirror images of one another. The first MRAM cell 102 and the second MRAM 104 cell share the common source 108. The cross sectional view shown in FIG. 4 is Y2-Y2' (cross-section indicator 126 of FIG. 1).

A drain 110 is connected to the drain contact shunt 114, which is situated in the M1 metal layer. The M1 metal layer is situated above the transistor 112. An electrical via 123 connects the drain contact shunt 114 to a portion 122 of a M2 metal layer that is proximate to the M1 metal layer. The via 130 connects the M2 metal layer portion 122 to a portion 140 of an M3 metal layer that is situated above the M2 metal layer and is connected to a lower contact of the Magnetic Tunnel Junction (MTJ) 150. An upper contact of the MTJ 150 is connected to a portion 160 of an M4 metal layer. The portion 160 of the M4 metal layer can carry current from each of the two illustrated MTJs 150. Each metal layer portion may be insulated from other metal layer portions by InterMetallic Dielectric (IMD) Oxide, such as IMD Oxide portions 420, 430, 440, and 450. An Interlayer Dielectric (ILD) Oxide 410 can insulate a drain contact 117 from surrounding surfaces and the ILD Oxide 410 can add structural support to the apparatus 400.

Conductive portions 470 and 472 are formed from portions of a metal layer M5 and are electrically insulated from one another. Each of the conductive portions 470 and 472 is capable of carrying a signal and each conductive portion 470 and 472 is electrically insulated from the first MRAM cell 102 and from the second MRAM cell 104.

Figure 5:
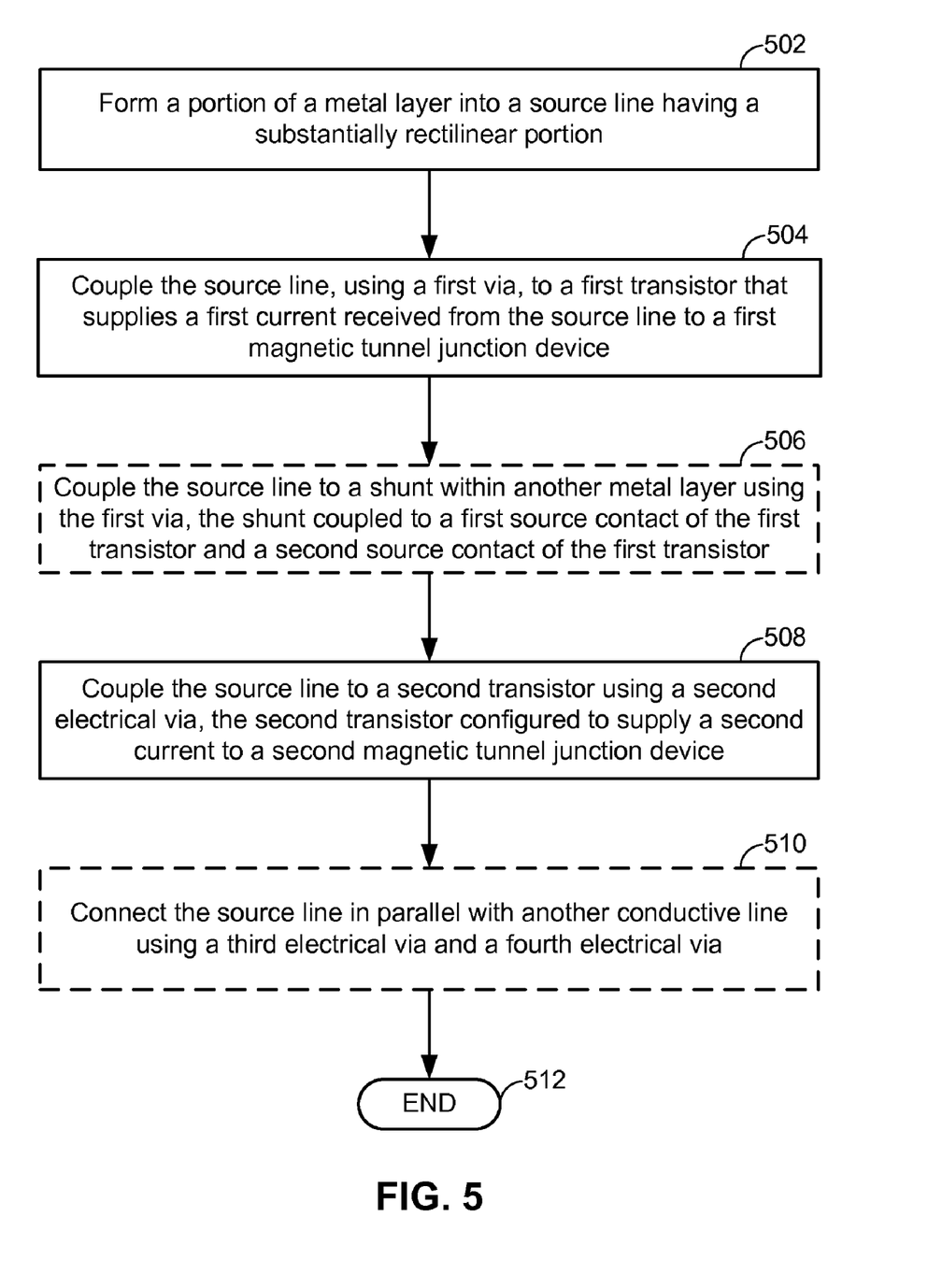
FIG. 5 is a flow chart of a particular illustrative embodiment of a method of making an MRAM device.

FIG. 5 is a flow chart of a particular illustrative embodiment of a method of making an MRAM device. A source line, such as the source line 120 of FIGS. 1-3 having a substantially branchless rectilinear portion is formed in a portion of a metal layer, at 502. In a particular illustrative embodiment, the source line is fabricated by masking portions of a second metal layer M2 and removing exposed portions of M2 by an etching process. The source line is coupled to a first magnetic tunnel junction (MTJ) device using a first via to a first transistor that supplies a first current received from the source line, at 504. For example, the source line 120 is coupled to the first transistor 112 by the via 118 and supplies current to the MTJ device 150, as shown in FIGS. 1-2. In a particular illustrative embodiment, the conductive via is fabricated by etching a hole within an insulating layer and depositing metal along sidewalls of the hole to form a conductive coupling between conducting layers.

Optionally, the source line is coupled to a conductive shunt within another metal layer using the first via and the conductive shunt is coupled to a first source contact of the first transistor and to a second source contact of the first transistor, at 506. For example FIGS. 1-2 show the source contact shunt 106 coupled to the source contacts 116. The source line is coupled to a second transistor using a second electrical via to supply a second current to a second magnetic tunnel junction device, at 508. For example, FIG. 3 shows a via coupling the source line 120 to an MRAM cell 302. The source line is optionally connected in parallel with another conductive line using a third electrical via and a fourth electrical via, at 5 10. For example, FIGS. 2-3 show the source line 120 coupled with a parallel conductive line 240 using vias 230.

In a particular illustrative embodiment, each of the above actions 502, 504, 506, 508, 510, are performed by a processor integrated into an electronic device. In another particular illustrative embodiment, some of the actions (e.g., 502, 504, and 508) are performed by the processor integrated into the electronic device. The method ends at 512.

Figure 6:
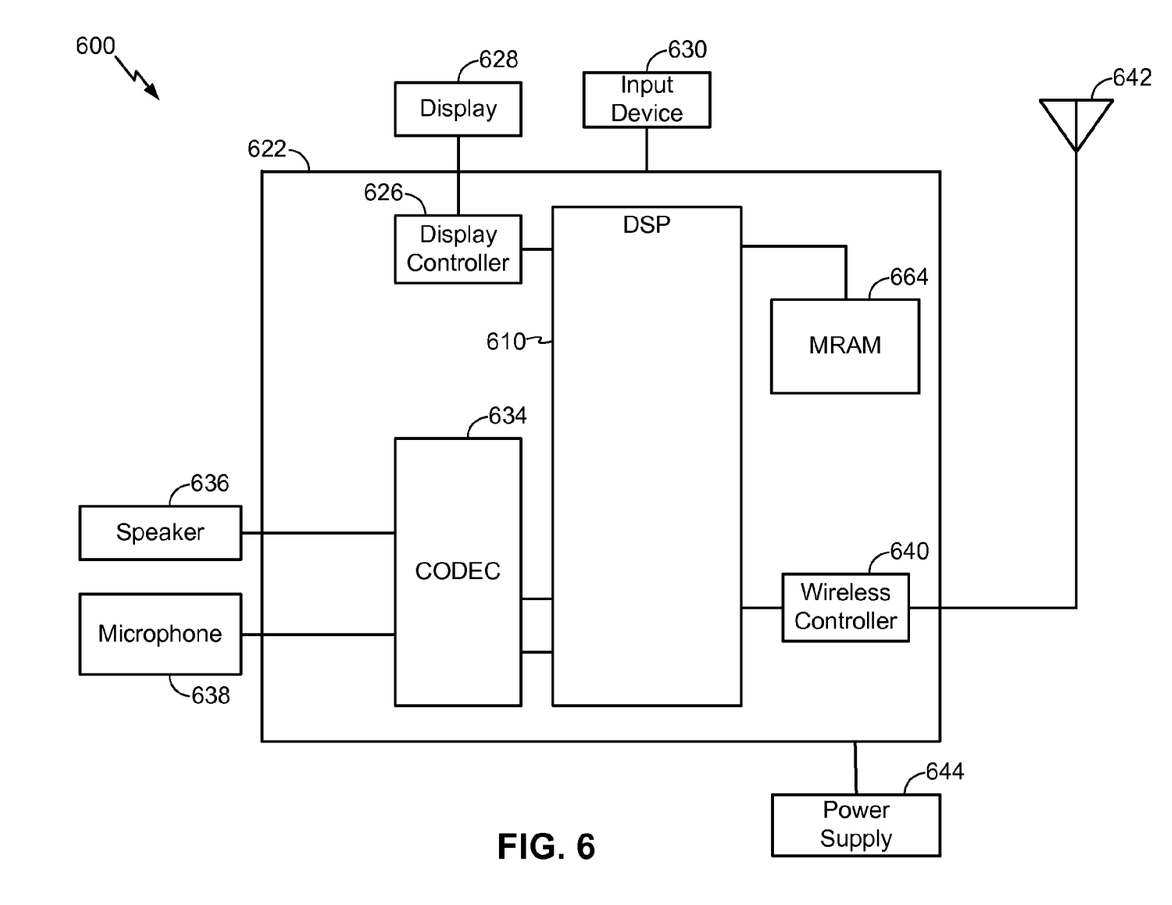
FIG. 6 is a block diagram of portable device including an MRAM system, according to a particular embodiment.

Referring to FIG. 6, a block diagram of a particular illustrative embodiment of an electronic device, such as a communication device, utilizing an MRAM system is depicted and generally designated 600. The electronic device 600 includes a processor, such as a digital signal processor (DSP) 610. The electronic device 600 also includes a Magnetic Random Access Memory (MRAM) 664 coupled to the DSP 610. In an illustrative example, the MRAM 664 may be formed according to any of FIGS. 1-5, or any combination thereof.

FIG. 6 also shows a display controller 626 that is coupled to the digital signal processor 610 and to a display 628. A coder/decoder (CODEC) 634 can also be coupled to the digital signal processor 610. A speaker 636 and a microphone 638 can be coupled to the CODEC 634.

FIG. 6 also indicates that a wireless controller 640 can be coupled to the digital signal processor 610 and to a wireless antenna 642. In a particular embodiment, the MRAM 664, the DSP 610, the display controller 626, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the wireless antenna 642, and the power supply 644 are external to the system-on-chip device 622. However, each of the display 628, the input device 630, the speaker 636, the microphone 638, the wireless antenna 642, and the power supply 644 can be coupled to a component of the system-on-chip device 622, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices that employ MRAM, such as the device of FIG. 6.

Figure 7:
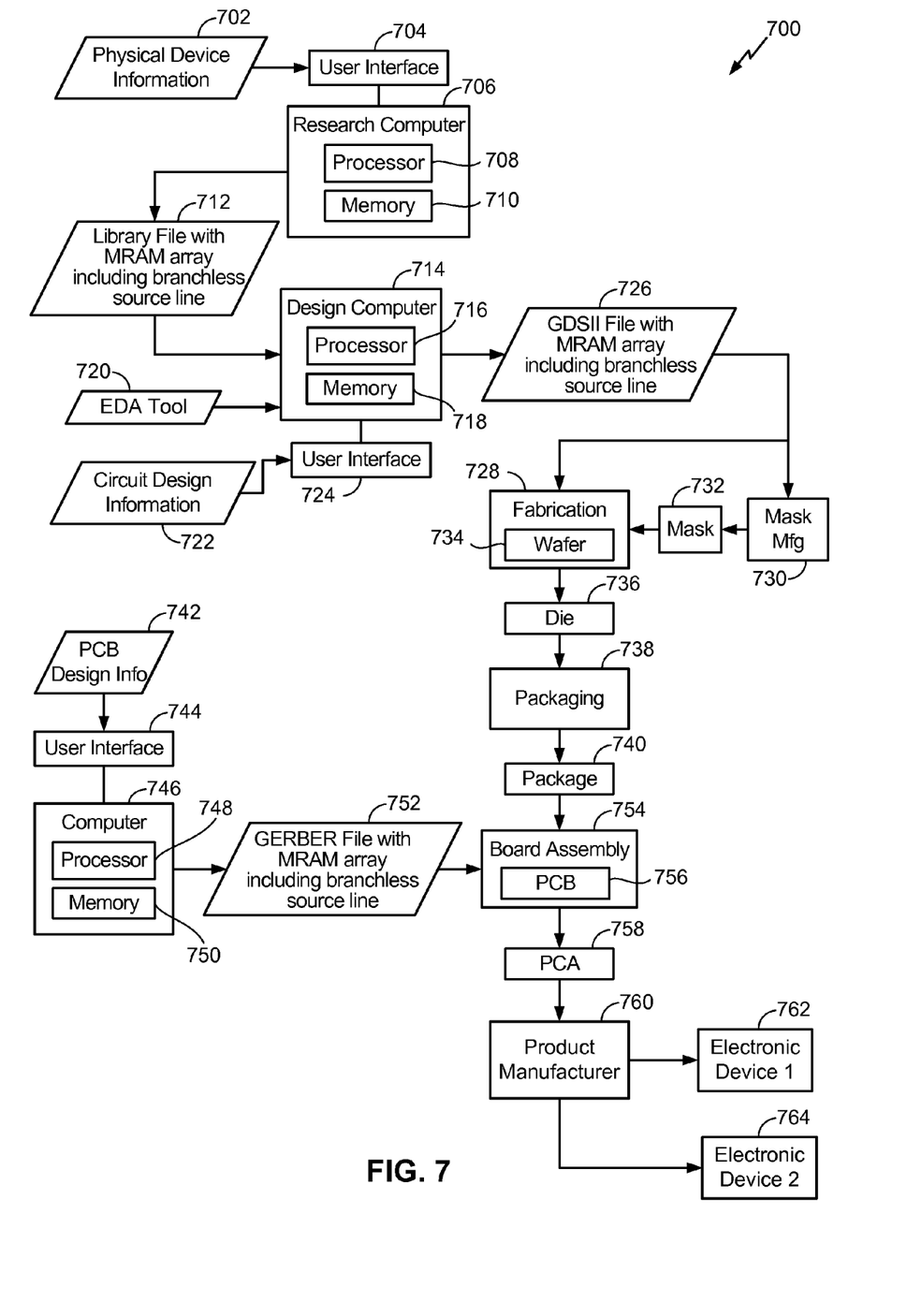
FIG. 7 depicts a particular illustrative embodiment of an electronic device manufacturing process 700.

FIG. 7 depicts a particular illustrative embodiment of an electronic device manufacturing process 700. Physical device information 702 is received in the manufacturing process 700, such as at a research computer 706. The physical device information 702 may include design information representing at least one physical property of a semiconductor device, such as the MRAM devices and systems illustrated in FIGS. 1-5, or any combination thereof. For example the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including the MRAM 664 of FIG. 6, the MRAM apparatus and systems of FIGS. 1-5, or any combination thereof, which is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit using the MRAM methods, apparatus and systems of FIGS. 1-5, the electronic device of FIG. 6, or any combination thereof, of the library file 712. For example, a user of the design computer 714 may enter circuit design information 722 via a user interface 724 coupled to the design computer 714. The circuit design information 722 may include design information representing at least one physical property of a semiconductor device, such as the branchless source lines in the MRAM apparatus and systems of FIGS. 1-5, the communication device of FIG. 6, or any combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722 to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing any of the MRAM apparatus, systems, and methods of FIGS. 1-5 that include a branchless source line, in addition to other circuits or information. To illustrate, the data file may include information corresponding to a system-on-chip (SOC) that includes the communication device of FIG. 6 and that also includes additional electronic circuits and components within the SOC.

The GDSII file 726 may be received at a fabrication process 728 to manufacture the MRAM apparatus and system including the branchless source line of FIGS. 1-3, according to transformed information in the GDSII file 726. For example, a device manufacture process may include providing the GDSII file 726 to a mask manufacturer 730 to create one or more masks, such as masks to be used for photolithography processing, illustrated as a representative mask 732. The mask 732 may be used during the fabrication process to generate one or more wafers 734, which may be tested and separated into dies, such as a representative die 736. The die 736 includes a circuit including one or more of the MRAM apparatus and systems of FIGS. 1-5, the electronic device of FIG. 6, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the MRAM apparatus and systems of FIGS. 1-5, the electronic device of FIG. 6, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including any of the MRAM apparatus and systems of FIGS. 1-5, the communication device of FIG. 6, or any combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines for performing various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set-top box, a music player, a video player, an entertainment unit, a navigation device, a communications device, a personal digital assistant (PDA), a fixed location data unit, and a computer. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-6 may illustrate remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Thus, the MRAM apparatus and systems of any of FIGS. 1-6 may be fabricated, processed, and incorporated into an electronic device, as described in the illustrative process 700. One or more aspects of the embodiments disclosed with respect to FIGS. 1-5 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity, or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of making a magnetic tunnel junction memory system, the method comprising:
    forming a portion of a metal layer into a source line having a substantially rectilinear portion;
    coupling the source line, at the substantially rectilinear portion, to a first transistor using a first via, wherein the first transistor is configured to supply a first current received from the source line to a first magnetic tunnel junction device; and
    coupling the source line to a second transistor using a second via, wherein the second transistor is configured to supply a second current received from the source line to a second magnetic tunnel junction device,
    wherein a portion of the source line is connected with a portion of another electrically conductive line by use of a third via and a fourth via.

2. The method of claim 1, wherein the source line is substantially branchless.

3. The method of claim 1, wherein the metal layer is substantially planar and is located at a first distance from the first transistor and at a second distance from the second transistor.

4. The method of claim 3, wherein the first distance and the second distance are substantially the same.

5. The method of claim 1, wherein the first via connects the source line to a shunt within another metal layer, and wherein the shunt is coupled to:
    a first source contact coupled to a source terminal of the first transistor; and
    a second source contact coupled to the source terminal of the first transistor.

6. The method of claim 1, wherein the forming of the metal layer, electrically connecting the source line to the first transistor, and electrically connecting the source line to the second transistor are controlled by a processor integrated into an electronic device.

7. A method comprising:
   a first step for forming a portion of a metal layer into a source line having a substantially rectilinear portion;
   a second step for coupling the source line, at the substantially rectilinear portion, to a first transistor using a first via, wherein the first transistor is configured to supply a first current received from the source line to a first magnetic tunnel junction device; and
   a third step for coupling the source line to a second transistor using a second via, wherein the second transistor is configured to supply a second current received from the source line to a second magnetic tunnel junction device,
   wherein a portion of the source line is connected with a portion of another electrically conductive line by use of a third via and a fourth via.

8. The method of claim 7, wherein the first step, the second step, and the third step are performed by a processor integrated into an electronic device.

9. An apparatus comprising:
   a memory to store data, the memory comprising:
      a first transistor including a first source terminal;
      a first magnetic tunnel junction (MTJ) device connected to the first transistor; and
      a source line that is conductive and that includes a first region that is substantially rectilinear, the source line to supply a first current to the first transistor at the first source terminal, wherein the source line is coupled from the first region to the first source terminal using a first via, and wherein the source line is to supply a second current to a second transistor,
      wherein the first via couples the source line to a shunt portion of a first metal layer that is coupled to the first source terminal.

10. The apparatus of claim 9, wherein the source line is substantially branchless.

11. The apparatus of claim 9, further comprising a processor to retrieve a portion of the stored data in the memory and to provide processed data to an output device.

12. The apparatus of claim 9, wherein the apparatus is operative to provide wireless communication to a remote station.

13. The apparatus of claim 12, wherein the remote station comprises one of a cell phone, a personal digital assistant, and a set-top box.

14. The apparatus of claim 9, wherein the source line is electrically connected to the second transistor using a second via.

15. The apparatus of claim 9, wherein the shunt portion is coupled to a first source contact that is coupled to the first source terminal and the shunt portion is coupled to a second source contact that is coupled to the first source terminal.

16. The apparatus of claim 9, wherein the second transistor is to provide a portion of the second current to a second MTJ device.

17. The apparatus of claim 9, further comprising a conductive line that is connected in parallel with at least a portion of the source line using a third via and a fourth via.

18. The apparatus of claim 9, further comprising a third transistor that utilizes the first source terminal of the first transistor as a common source terminal, the third transistor to provide a third current to a third MTJ device.

19. The apparatus of claim 9, integrated in at least one semiconductor die.

20. The apparatus of claim 9, further comprising a device selected from the group consisting of a set-top box, a music player, a video player, an entertainment unit, a navigation device, a communications device, a personal digital assistant (PDA), a fixed location data unit, and a computer, into which the memory is integrated.

21. A computer-readable tangible medium comprising computer-executable instructions to cause a semiconductor fabrication system to:
   form a source line comprising conductive material having a substantially rectilinear region, the source line to supply current to a first memory cell and to a second memory cell;
   wherein the first memory cell includes a first transistor coupled to the source line using a first via, the first transistor to supply a first current to a first magnetic tunnel junction (MTJ) device;
   wherein the second memory cell includes a second transistor coupled to the source line using a second via, the second transistor to supply a second current to a second MTJ device; and
   wherein the first via directly connects the source line to an electrical shunt that is coupled to a source contact of the first transistor and of the second transistor.

22. The computer-readable tangible medium of claim 21, wherein the source line is formed in a first portion of a metal layer, and wherein the first MTJ device is electrically connected to the first transistor by a second portion of the metal layer.

23. The computer-readable tangible medium of claim 21, wherein the first memory cell includes a third transistor having a third transistor source terminal comprising the first transistor source terminal.

24. The computer-readable tangible medium of claim 21, further comprising executable instructions to cause the semiconductor fabrication system to form a secondary source line that is conductive, and to connect the secondary source line in parallel with at least a portion of the source line using a third via and a fourth via.

25. Apparatus for making a magnetic tunnel junction memory device, the apparatus comprising:
   means for forming a source line having a substantially rectilinear portion;
   means for coupling the source line to a first transistor by use of a first via, wherein the first transistor is configured to supply a first current received from the source line to a first magnetic tunnel junction device; and
   means for coupling the source line to a second transistor using a second via, wherein the second transistor is configured to supply a second current received from the source tine to a second magnetic tunnel junction device,
   wherein a portion of the source line is connected with a portion of another electrically conductive line by use of a third via and a fourth via.

26. The apparatus of claim 25, wherein the source line is substantially branchless.

27. The apparatus of claim 25, further comprising means for coupling the source tine to a third transistor using a third via, wherein the third transistor is configured to supply a third current received from the source line to a third magnetic tunnel junction device, and wherein the third transistor shares a source terminal with the first transistor.

28. The apparatus of claim 25, integrated in at least one semiconductor die.

29. The apparatus of claim 25, further comprising a device selected from the group consisting of a set-top box, a music player, a video player, an entertainment unit, a navigation device, a communications device, a personal digital assistant (PDA), a fixed location data unit, and a computer, into which the magnetic tunnel junction memory device is integrated.

30. A method comprising:
receiving design information representing at least one physical property of a semiconductor device, the semiconductor device including a memory to store data, the memory comprising:
a first transistor including a first source terminal;
a first magnetic tunnel junction (MTJ) device coupled to the first transistor; and
a source line that is conductive and that includes a first region that is substantially rectilinear, the source line to supply a first current to the first transistor at the first source terminal, wherein the source line couples the first region to the first source terminal using a first via, wherein the source line is to supply a second current to a second transistor, and wherein the first via couples the source line to a shunt portion of a first metal layer that is coupled to the first source terminal;
transforming the design information to comply with a file format; and
generating a data file including the transformed design information.

31. The method of claim 30, wherein the file format is a GDSII format.

32. A method comprising:
receiving a data file including design information corresponding to a semiconductor device; and
fabricating the semiconductor device according to the design information, wherein the semiconductor device includes a memory to store data, the memory comprising:
a first transistor including a first source terminal;
a first magnetic tunnel junction (MTJ) device coupled to the first transistor; and
a source line that is conductive and that includes a first region that is substantially rectilinear, the source line to supply a first current to the first transistor at the first source terminal, wherein the source line couples the first region to the first source terminal using a first via, wherein the source tine is to supply a second current to a second transistor, and wherein the first via couples the source line to a shunt portion of a first metal layer that is coupled to the first source terminal.

33. The method of claim 32, wherein the file format is a GDSII format.

34. A method comprising:
receiving design information including physical positioning information of a packaged semiconductor device on a circuit board, the packaged semiconductor device including a semiconductor structure comprising:
a first transistor including a first source terminal;
a first magnetic tunnel junction (MTJ) device coupled to the first transistor; and
a source line that is conductive and that includes a first region that is substantially rectilinear, the source line to supply a first current to the first transistor at the first source terminal, wherein the source line couples the first region and the first source terminal using a first via, wherein the source line is to supply a second current to a second transistor, and wherein the first via couples the source line to a shunt portion of a first metal layer that is coupled to the first source terminal; and
transforming the design information to generate a data file.

35. The method of claim 34, wherein the data file has a GERBER format.

36. A method comprising:
receiving a data file including design information including physical positioning information of a packaged semiconductor device on a circuit board; and
manufacturing the circuit board according to the design information, wherein the packaged semiconductor device includes:
a first transistor including a first source terminal;
a first magnetic tunnel junction (MTJ) device coupled to the first transistor; and
a source line that is conductive and that includes a first region that is substantially rectilinear, the source line to supply a first current to the first transistor at the first source terminal, wherein the source line couples the first region and the first source terminal using a first via, wherein the source line is to supply a second current to a second transistor, and wherein the first via couples the source line to a shunt portion of a first metal layer that is coupled to the first source terminal.

37. The method of claim 36, wherein the data file has a GERBER format.

38. The method of claim 36, further comprising integrating the circuit board into a device selected from the group consisting of a set-top box, a music player, a video player, an entertainment unit, a navigation device, a communications device, a personal digital assistant (PDA), a fixed location data unit, and a computer.

* * * * *